(12) United States Patent
Kwon et al.

(10) Patent No.: US 9,224,697 B1
(45) Date of Patent: Dec. 29, 2015

(54) MULTI-DIE INTEGRATED CIRCUITS IMPLEMENTED USING SPACER DIES

(71) Applicant: Xilinx, Inc., San Jose, CA (US)

(72) Inventors: Woon-Seong Kwon, Cupertino, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/100,749

(22) Filed: Dec. 9, 2013

(51) Int. Cl.
*H01L 21/00* (2006.01)
*H01L 23/00* (2006.01)

(52) U.S. Cl.
CPC ............. *H01L 23/562* (2013.01); *H01L 24/95* (2013.01)

(58) Field of Classification Search
CPC .......... H01L 2224/16225; H01L 2224/3225; H01L 2224/73265; H01L 2224/48091; H01L 2224/48227; H01L 2224/73204; H01L 2224/32145; H01L 23/49816; H01L 23/3128; H01L 23/49827; H01L 23/481; H01L 23/50; H01L 25/18; H01L 25/105; H01L 25/0657
USPC .............. 257/737–738, 777, 778, 685–686; 438/106, 107, 109, 110, 108, 112, 124, 438/126, 127
See application file for complete search history.

(56) References Cited

U.S. PATENT DOCUMENTS 8,779,599 B2 * 7/2014 Lin et al. ........................ 257/774

* cited by examiner

*Primary Examiner* — Hoa B Trinh
(74) *Attorney, Agent, or Firm* — Kevin T. Cuenot

(57) ABSTRACT

An integrated circuit includes an interposer die having a surface, a first die mechanically and electrically attached to the surface of the interposer die, and a second die only mechanically attached to the surface of the interposer die using a die attach adhesive.

16 Claims, 6 Drawing Sheets

MULTI-DIE INTEGRATED CIRCUITS IMPLEMENTED USING SPACER DIES

FIELD OF THE INVENTION

This disclosure relates to integrated circuits (ICs) and, more particularly, to multi-die ICs implemented using spacer die(s).

BACKGROUND

An integrated circuit (IC) that includes two or more dies within a single package is referred to as a "multi-die IC." One type of multi-die IC, referred to as a "stacked die IC," is formed by stacking multiple dies. In some cases, a stacked die IC is formed by stacking two or more dies on a surface of another die called an "interposer." The interposer may provide signal lines, e.g., wires, communicatively linking the various dies attached, or stacked, on the surface of the interposer.

During manufacture, a stacked die IC is susceptible to warpage and, more particularly, warpage of the interposer. Warpage of the interposer may cause defects in the stacked die IC such as inconsistent interconnect formation between interposer and the dies attached thereto and/or between the interposer and a substrate. Warpage may be caused by a variety of different factors. Exemplary factors include, but are not limited to, thickness of the interposer die, processing temperatures, e.g., during solder reflow, differences in coefficient of thermal expansion (CTE) between the interposer die, other dies, and/or substrate, and variance in the thickness of layers of the multi-die IC such as layers of the dies and/or layers of the packaging materials.

Some varieties of stacked die ICs are homogeneous. Homogeneous stacked die ICs generally have a uniform distribution of functional dies attached to the surface of the interposer. In a homogeneous stacked die IC, the surface of the interposer to which other dies are attached does not include regions of any significant size that are unoccupied by attached, functional dies. As a result, homogeneous stacked die ICs exhibit uniform warpage behavior during manufacture that does not lead to an unacceptable number of defects.

Other varieties of stacked die ICs are heterogeneous. Heterogeneous stacked die ICs generally have a non-uniform distribution of functional dies attached to the surface of the interposer. In a heterogeneous stacked die IC, the surface of the interposer die to which other dies are attached does include one or more regions that are unoccupied by attached, functional dies. Typically, these unoccupied regions result from the use of multiple dies of differing size. Heterogeneous stacked die ICs exhibit non-uniform warpage behavior that does lead to an unacceptable number of defects if the non-uniform distribution of dies is not addressed during manufacture.

SUMMARY

An integrated circuit (IC) includes an interposer die having a surface, a first die mechanically and electrically attached to the surface of the interposer die, and a second die only mechanically attached to the surface of the interposer die using a die attach adhesive.

In one aspect, the second die is not electrically attached to the first surface of the interposer die. In a further aspect, the second die does not include functional circuitry. In one example, the second die does not include inter-die electrical connecting structures configured to contact solder bumps.

The first die can include functional circuitry that is electrically connected to functional circuitry within the interposer die. For example, the first die can be attached to the first surface of the interposer die using a plurality of solder bumps. In one aspect, the first die is under-filled and the second die is not under-filled.

The IC also can include a third die mechanically and electrically attached to the first surface of the interposer die. The first die and the third die can be communicatively linked by a wire of the interposer die.

A method includes providing an interposer die having a first surface, mechanically and electrically attaching a first die to the first surface of the interposer die, and attaching, only mechanically, a second die to the first surface of the interposer die using a die attach adhesive.

In one aspect, the interposer die is in wafer form.

Mechanically and electrically attaching the first die to the first surface of the interposer die can include connecting functional circuitry within the first die to functional circuitry within the interposer die. For example, mechanically and electrically attaching the first die to the first surface of the interposer die can include connecting the first die to the first surface of the interposer die using a plurality of solder bumps. The method further can include applying under-fill to the first die.

The second die can be mechanically attached to the surface of the interposer die without using solder bumps and without using under-fill. The method also can include only mechanically attaching the second die to the surface of the interposer die subsequent to connecting the first die to the surface of the interposer die using the plurality of solder bumps.

The method can include applying the die attach adhesive to a surface of the second die and placing the surface of the second die in mechanical contact with the surface of the interposer die. The die attach adhesive can be applied to the surface of the second die while still in wafer form.

The method further can include mechanically and electrically attaching a third die to the surface of the interposer die. The first die and the third die can be communicatively linked by a wire of the interposer die.

A wafer includes a plurality of functional sites, wherein a functional die is mechanically and electrically attached to a surface of each functional site using a plurality of solder bumps. The wafer further includes one or more spacer die sites. Each spacer die site includes a spacer die only mechanically attached to a surface of the spacer die site using a die attach adhesive and includes no functional die.

In one aspect, each functional site includes one or more spacer dies only mechanically attached to the surface of the functional site.

BRIEF DESCRIPTION OF THE DRAWINGS

FIGS. 4-1 and 4-2 are diagrams that, taken collectively, illustrate the heterogeneity of the multi-die IC of FIG. 1.

DETAILED DESCRIPTION OF THE DRAWINGS

Figure 1:
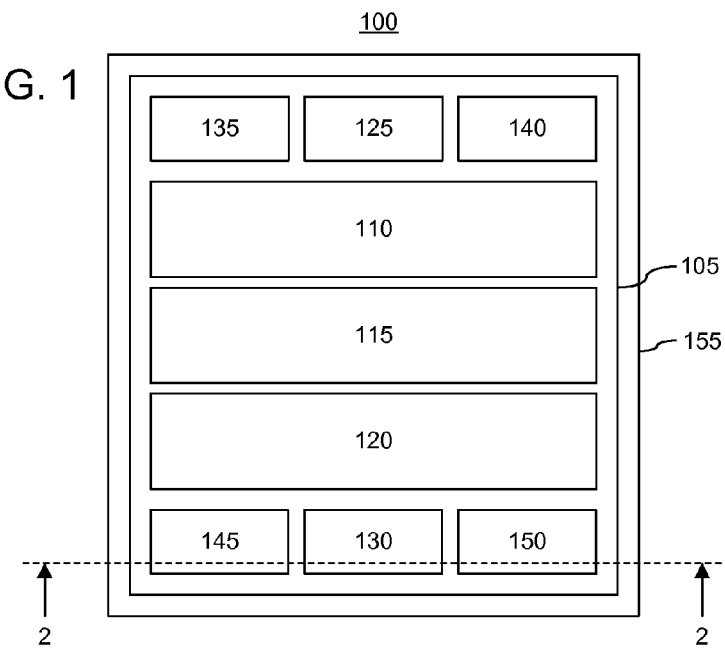
FIG. 1 is a diagram illustrating a top view of an exemplary multi-die integrated circuit (IC).

While the disclosure concludes with claims defining novel features, it is believed that the various features described herein will be better understood from a consideration of the description in conjunction with the drawings. The process (es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to multi-die ICs implemented using one or more spacer dies. A multi-die IC is an IC formed of two or more dies that operate cooperatively within a single package. One type of multi-die IC is referred to as a "stacked die IC." A stacked die IC includes a die referred to as an "interposer" to which one or more other dies are attached. The interposer may be an entirely passive die or be an active die. A "passive die" is a die that does not include any active devices. In illustration, a passive die does not include any p-n or n-p junctions. Within this specification, the term "die" means a "semiconductor IC die."

In the case of heterogeneous stacked die ICs, warpage occurs, at least in part, due to regions on the surface of the interposer that are unoccupied by attached dies. The stacked die IC typically includes one or more dies that are both mechanically and electrically attached to the surface of the interposer. As used within this disclosure, the phrase "functional die" means a die that is both mechanically and electrically attached to the interposer. A functional die includes circuitry that is electrically connected to circuitry within the interposer. One way of attaching a functional die to the interposer is through the use of solder bumps. Solder bumps effectuate both mechanical and electrical attachment of a die to the interposer.

To address warpage, one or more spacer dies may be located in regions on the surface of the interposer that are unoccupied by functional dies. As used within this disclosure, the phrase "spacer die" means a die that is only mechanically attached to the interposer. A spacer die is not electrically attached to the interposer and, as such, does not electrically interact with the interposer or with other dies attached to the interposer. In conventional, heterogeneous multi-die ICs, the spacer dies are mechanically attached to the interposer using the same mechanism of attachment, e.g., solder bumps, as is used for the functional dies. Solder bumps, however, are a complex and costly mechanism for attaching dies.

In accordance with the inventive arrangements described herein, spacer dies are mechanically attached to the interposer using a die attach adhesive. The die attach adhesive allows spacer dies to be mechanically attached to the interposer in less time, with less complexity, and with less cost than using solder bump technology. Once attached using a die attach adhesive, the spacer die is reliably attached to the interposer and becomes part of the multi-die IC structure. The resulting stacked die IC with spacer die(s) mechanically attached using die attach adhesive is less susceptible to defects from warpage.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a diagram illustrating a top view of an exemplary multi-die integrated circuit (IC) 100. IC 100 illustrates an example of a packing approach to stacking multiple dies within a single package and, as such, is an example of a stacked die IC.

IC 100 includes an interposer 105, functional dies 110, 115, 120, 125, and 130, and spacer dies 135, 140, 145, and 150. Each of dies 110, 115, 120, 125, 130, 135, 140, 145, and 150 is mechanically attached to a top surface of interposer 105. Functional dies 110, 115, 120, 125, and 130 are also electrically attached to interposer 105. Thus, dies 110, 115, 120, 125, and 130 are both mechanically and electrically attached to interposer 105. By comparison, spacer dies 135, 140, 145, and 150 are not electrically attached to interposer 105. As noted, spacer dies 135, 140, 145, and 150 are only mechanically attached to interposer 105.

IC 100 further may include a substrate 155. The bottom surface of interposer 105 is attached to a top surface of substrate 155. In one aspect, substrate 155 is a package substrate. In another aspect, substrate 155 is a printed circuit board or other structure upon which interposer 105 may be attached or otherwise mounted.

As previously discussed, interposer 105 is a die. The top surface of interposer 105, to which other dies are attached and horizontally stacked, is planar. In the example of FIG. 1, interposer 105 has nine dies attached thereto. The number of dies attached to interposer 105, whether functional dies and/or spacer dies, is not intended as a limitation. A multi-die IC may include fewer than nine dies or more than nine dies attached to an interposer. Further, the dies attached to the interposer of the multi-die IC may vary in size and/or type.

IC 100 is an example of a heterogeneous stacked die IC structure. Were spacer dies 135, 140, 145, and 150 not attached or included in IC 100, the top surface of interposer 105 would have empty regions. The empty regions of the surface of interposer 105 would be unoccupied by any die. The heterogeneity of IC 100 is due, at least in part, to the varied size of functional dies attached thereto resulting in empty regions unless spacer dies are included. In the example of FIG. 1, spacer dies 135, 140, 145, and 150 are included to reduce warpage of interposer 105 during manufacture.

Interposer 105 provides a common mounting surface for mechanically attaching each of dies 110, 115, 120, 125, 130, 135, 140, 145, and 150. The top surface of interposer 105 provides an electrical coupling point for dies 110, 115, 120, 125, and 130. The manufacturing of interposer 105 can include one or more process steps that allow the deposition of one or more conductive layers that are patterned to form wires. These conductive layers may be formed of aluminum, gold, copper, nickel, various silicides, and/or the like. Interposer 105 can be manufactured using one or more additional process steps that allow the deposition of one or more dielectric or insulating layer(s) such as, for example, silicon dioxide.

Interposer 105 also may include vias and through vias (TVs). TVs may be through silicon vias (TSVs) in the case where interposer 105 is implemented using silicon, through glass vias (TGVs) in the case where interposer 105 is formed using glass, or other via structures depending upon the particular materials used to implement interposer 105 and the substrate thereof. When interposer 105 is implemented as a passive die, interposer 105 may only have various types of solder bumps, vias, wires, TVs, and under bump metallization (UBM). When implemented as an active die, however, interposer 105 may include additional process layers forming one or more active devices.

Each of functional dies 110, 115, 120, 125, and 130 may be implemented as a passive die or an active die including one or more active devices. For example, one or more of dies 110, 115, 120, 125, and 130 may be memory dies, processor (central processing unit) dies, dies having programmable circuitry, application specific IC (ASIC) dies, mixed signal dies, or the like. Further, die 110 may be implemented as one type of die, while die 115 is implemented as another different type of die, die 120 is implemented as yet another different type of die, etc. For example, IC 100 can include a processor die, a programmable IC die, and a memory die coupled to interposer 105. In another example, IC 100 may be formed of two memory dies and a processor die attached to interposer 105. The examples provided herein are for purposes of illustration only and not intended as limitations.

In one particular example, functional dies 110, 115, and 120 are implemented as programmable dies such as field programmable gate array (FPGA) dies. Functional dies 125 and 130 are implemented as ASICs. As used herein, a "programmable die" refers to a die that includes programmable circuitry and, as such, may be programmed to perform specified logic functions. A specific example of a programmable die is an FPGA die.

An FPGA die typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA die by an external device. The collective states of the individual memory cells then determine the function of the FPGA die.

Another specific example of a programmable die is a complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable dies, the functionality of the die is controlled by data bits provided to the die for that purpose. The data bits can be stored in volatile memory (e.g., static memory cells, as in FPGAs and some CPLDs), in non-volatile memory (e.g., FLASH memory, as in some CPLDs), or in any other type of memory cell.

Other exemplary programmable dies may be implemented in other ways, e.g., using fuse or antifuse technology. The phrase "programmable die" can include, but is not limited to these types of dies and further can encompass dies that are only partially programmable. For example, a programmable die may include a combination of hard-coded transistor logic and a programmable switch fabric that programmably interconnects the hard-coded transistor logic. It should be appreciated that a programmable die may include one or more portions of programmable circuitry and one or more portions of other circuitry not programmable such as analog circuitry or other fixed circuitry such as a hardwired processor or the like.

Figure 2:
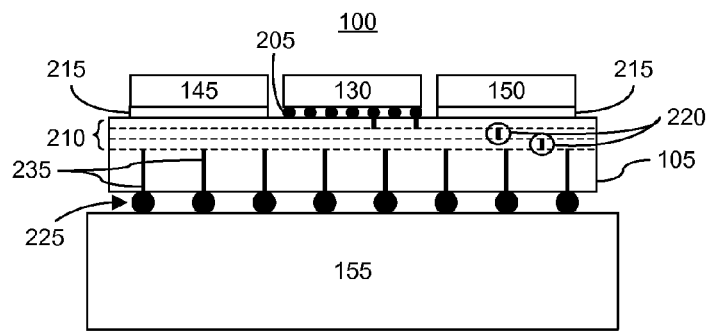
FIG. 2 is a cross-sectional side view of the multi-die IC of FIG. 1.

FIG. 2 is a cross-sectional side view of IC 100 of FIG. 1. More particularly, FIG. 2 illustrates a view of IC 100 of FIG. 1 taken along cut-line 2-2. Die 130 is mechanically and electrically attached to a first, i.e., the top, planar surface of interposer 105 via solder bumps 205. In one example, solder bumps 205 are implemented as micro-bumps. Though not visible in FIGS. 1 and 2, solder bumps also are used to mechanically and electrically attach dies 110, 115, 120, and 125 to the top surface of interposer 105. Interposer 105 includes an inter-die electrical connecting structure such as a pad beneath each solder bump 205. It should be appreciated, however, that any of a variety of other techniques may be used to attach functional dies such as die 130 to interposer 105. For example, bond wires or edge wires can be used electrically attach die 130 to interposer 105.

Spacer dies 145 and 150, as discussed, are not electrically attached to interposer 105. In the example of FIG. 2, spacer dies 145 and 150 are mechanically attached to the top surface of interposer 105 using a die attach adhesive 215. Though not visible in FIG. 2, spacer dies 135 and 140 also are mechanically attached to the top surface of interposer 105 using die attach adhesive 215.

As used within this disclosure, the phrase "die attach adhesive" means a material that is used to stack and mechanically attach one die to another die. Examples of die attach adhesives include, but are not limited to, materials considered die attach films, dicing die attach films, die attach pastes, self-filleting die attach pastes, and the like. In one aspect, die attach adhesive 215 is non-conductive. In general, die attach adhesive 215 may be applied to the backside of a die post dicing or to a wafer prior to dicing.

Interposer 105 includes one or more conductive layers 210 illustrated as dashed or dotted lines in interposer 105. Conductive layers 210 are implemented using any of a variety of metal layers as previously described. Conductive layers 210 are processed to form patterned metal layers that implement wires of interposer 105. A wire implemented within interposer 105 that couples at least two different dies, e.g., dies 110 and 115, dies 115 and 120, dies 110 and 120, dies 120 and 130, etc., is referred to as an inter-die wire. Inter-die wires pass inter-die signals between two or more functional dies. For example, an inter-die wire couples two different solder bumps 205 beneath different ones of the functional dies, thereby allowing the exchange of inter-die signals between two or more functional dies. Further, various wires of interposer 105, whether inter-die wires or wires coupling nodes of a same functional die, may be data wires or power wires. A power wire may be a Vcc power wire, e.g., a high voltage potential, or a Vss power wire having a ground or reference voltage potential.

Different ones of conductive layers 210 may be coupled together using vias 220. In general, a via structure is used to implement a vertical conductive path. In this regard, the vertical portions of wires, including any inter-die wires, that contact solder bumps 205 are implemented as vias 220. The use of multiple conductive layers to implement interconnects within interposer 105 allows a greater number of signals to be routed and more complex routing of signals to be achieved within interposer 105.

Solder bumps 225 can be used to mechanically and electrically couple a second planar surface of interposer 105, i.e., the bottom surface, to the top surface of substrate 155. In one aspect, solder bumps 225 can be implemented as controlled collapse chip connection (C4) balls. Substrate 155 includes conductive paths (not shown) that couple different ones of solder bumps 225 to one or more nodes beneath substrate 155. Accordingly, one or more of solder bumps 225 couple circuitry within interposer 105 to nodes external to IC 100 through circuitry or wiring within substrate 155.

TVs 235 are vias that form an electrical connection that vertically transverses, e.g., extends through a substantial portion, if not the entirety of, interposer 105. TVs 235, like wires and vias, may be formed of any of a variety of different conductive materials including, but not limited to, copper, aluminum, gold, nickel, various silicides, and/or the like. As pictured, each of TVs 235 extends from the bottom surface of interposer 105 up to a conductive layer 210 of interposer 105. TVs 235 further may be coupled to a solder bump 205 through one or more of conductive layers 210 in combination with one or more vias 220.

Figure 3:
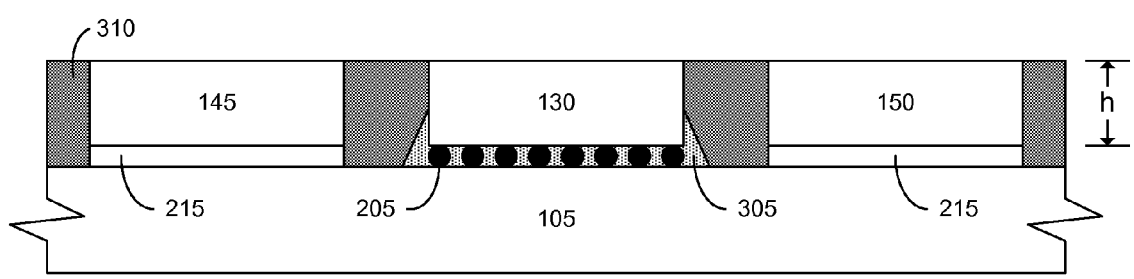
FIG. 3 is a cross-sectional side view of a portion of the multi-die IC of FIG. 1.

FIG. 3 is a cross-sectional side view of a portion of IC 100 of FIG. 1. FIG. 3 illustrates additional aspects of IC 100 while also abstracting various other details of IC 100. For example, circuitry within interposer 105 is not shown. Further, substrate 155 is not shown. With the exception of the noted abstractions, FIG. 3 is generally representative of a cross-sectional view taken along cut line 2-2.

As pictured and discussed, functional die 130 is mechanically and electrically attached to interposer 105 using solder bumps 205. In addition, an under-fill material 305 is used to further secure, e.g., mechanically attach, functional die 130 to the top surface of interposer 105. Spacer dies 145 and 150, being attached to interposer 105 using die attach adhesive 215, do not require any under-fill material to further secure the dies. In general, functional die 130 and spacer dies 145 and 150 have a height, or thickness, of "h." Having used under-fill material 305 to aid in mechanically attaching functional die 130 to interposer 105, a mold material 310 is applied that fills in gaps between adjacent dies, whether functional dies or spacer dies.

It should be appreciated that while IC 100 is shown as a standalone IC, the various processes discussed such as solder bumping, placing and/or attaching functional dies to interposer 105, placing and/or attaching spacer dies to interposer 105, applying under-fill material 305, and applying mold material 310 may be performed while interposer 105 is still in wafer form.

As noted, use of spacer dies helps to prevent defects that arise due to warpage of interposer 105. Were spacer dies 145 and 150, for example, not to be included in IC 100, then the regions on either side of functional die 130 would be filled with mold material 310. Application of mold material 310 results in application of stresses to interposer 105 that contributes to warpage of interposer 105. More particularly, uneven mold and silicon portions, e.g., where one has a non-uniform thickness, contributes to uneven package warpage and anomalous assembly joining. Non-uniform thickness results from application of mold material 310 to either side of functional die 130 when spacer dies 145 and 150 are not included.

Conventional techniques for incorporating spacer dies into a multi-die IC structure have relied upon the same die attach processes used to attach functional dies to an interposer. For example, one conventional technique for inclusion of spacer dies would attach spacer die 145 and spacer die 150 to the top surface of interposer 105 using solder bumps 205. This approach, however, is costly and time consuming. Further, using such an approach requires that spacer dies 145 and 150 be created to include inter-die electrical connecting structures that allow attachment through solder bumps 205. Inter-die electrical connecting structures include, for example, UBM, pads, or the like that are configured to contact solder bumps. This requirement also adds cost to implementation of the spacer dies which are not electrically connected to interposer 105.

Advantageously, using die attach adhesive to attach spacer dies to an interposer is faster and less expensive than using solder bumps. Using die attach adhesive, for example, requires less precision that solder bump formation. Further, cost reduction is achieved since the spacer dies need not have any inter-die electrical connecting structures or any circuit structures at all. For example, spacer dies 145 and 150 may be unprocessed portions of silicon substrate diced from a wafer. A spacer die, for example, can be implemented so as not to include any circuitry. In other cases, however, spacer dies 145 and 150 may be defective dies and/or partially processed dies that are diced from a wafer, e.g., where the spacer dies do not include functional circuitry. Use of a die attach adhesive does not require that spacer dies have the same precise inter-die electrical connecting structures as a functional die for attachment to interposer 105.

Figures 1, 4:
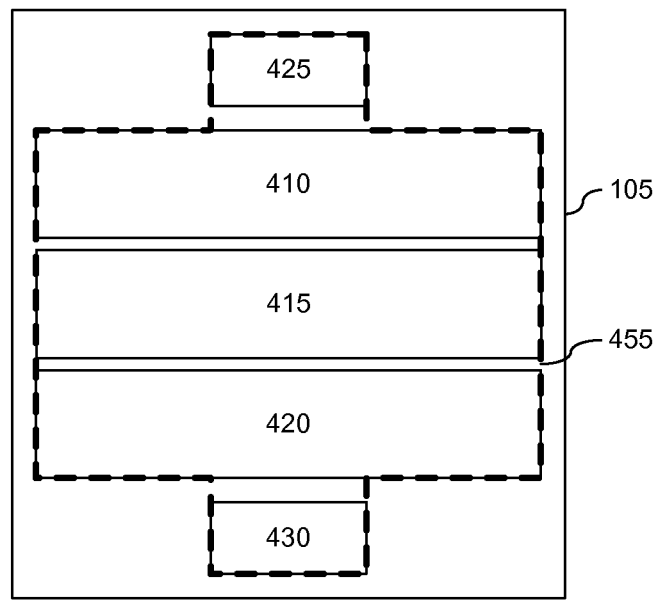
Figures 2, 4:
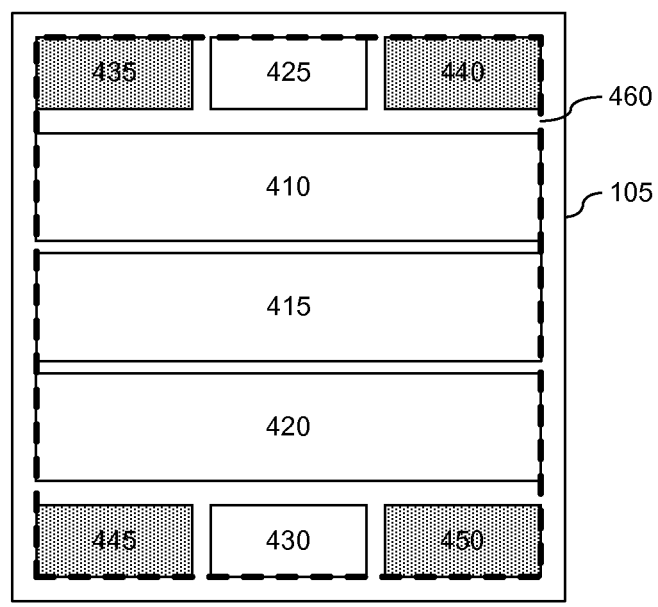

FIGS. 4-1 and 4-2 are diagrams that, taken collectively, illustrate the heterogeneity of IC 100 of FIG. 1. Both of FIGS. 4-1 and 4-2 illustrate a top view of interposer 105 with no dies attached thereto. The blocks pictured indicate die location.

Referring to FIG. 4-1, the particular locations where functional dies are to be located and attached to interposer 105 are illustrated with blocks. The placement of functional dies is illustrated with blocks 410, 415, 420, 425, and 430, which depict the location of dies 110, 115, 120, 125, and 130, respectively.

A heterogeneous IC is characterized by the use of different sized dies. As pictured, the placement of functional dies on the top surface of interposer 105 forms a perimeter 455 illustrated using a dashed line. Perimeter 455, which is formed by following an outer edge of the regions to be occupied by a functional die on the surface of interposer 105 is not rectangular in shape thereby indicating that IC 100 is heterogeneous.

Referring to FIG. 4-2, the particular locations where both functional dies and spacer dies are to be attached are illustrated with blocks. FIG. 4-2 is substantially similar to FIG. 4-1 except that the locations of spacer dies are now shown with shaded blocks 435, 440, 445, and 450, corresponding to spacer dies 135, 140, 145, and 150, respectively. After accounting for regions of the surface of interposer 105 that are to be occupied by a spacer die, perimeter 455 is redrawn as perimeter 460 to encompass blocks 435, 440, 445, and 450. With the regions to be occupied by spacer dies 135, 140, 145, and 150 now included, perimeter 460 is rectangular in shape as distinguished from perimeter 455.

Advantageously, as noted, using a die attach adhesive to attach spacer dies to interposer 105 relieves the spacer dies from having to include inter-die electrical connecting structures. Inter-die electrical connecting structures are required on the bottom surface of functional dies. Similarly, were spacer dies to be attached using solder bumps, such structures also would be required on the spacer dies. By using die attach adhesive, however, the inter-die electrical connecting structures are not needed and may be excluded from the spacer dies.

A further benefit of using die attach adhesive is that interposer 105 need not include any inter-die electrical connecting structures in the regions to be occupied by the spacer dies. Referring to FIG. 4-2, for example, regions 410, 415, 420, 425, and 430 each include a plurality of inter-die electrical connecting structures such as pads or UBM upon which solder bumps may be formed. By comparison, regions 435, 440, 445, and 450 need not include the inter-die electrical connecting structures. In consequence, the complexity and cost of both interposer 105 and spacer dies 135, 140, 145, and 150 is reduced.

Figure 5:
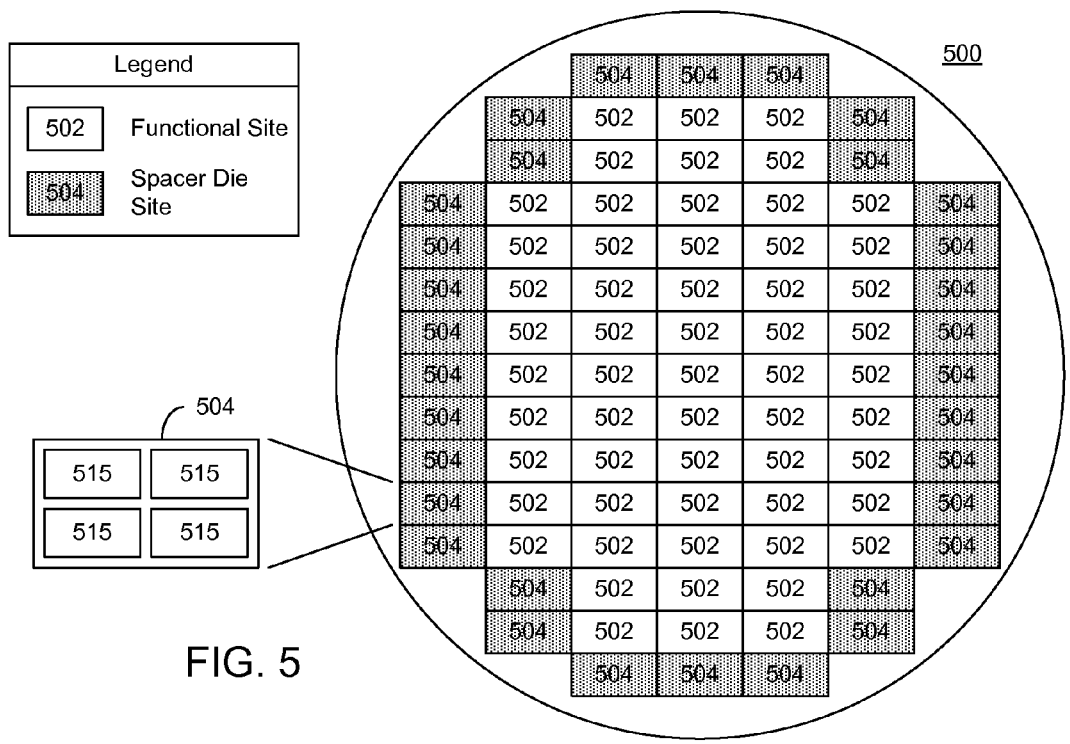
FIG. 5 is a diagram illustrating a top view of an exemplary implementation of a wafer.

FIG. 5 is a diagram illustrating a top view of an exemplary implementation of a wafer 500. Wafer 500 is manufactured to include functional sites 502 and spacer die sites 504. Functional sites 502 and spacer die sites 504 collectively may be referred to as "sites." Sites 502 and 504, while in wafer form, are dies to which one or more additional dies are attached on a top surface. In the example of FIG. 5, spacer die sites 504, which are pictured as shaded blocks, are located on the perimeter of wafer 500 and, as such, may be referred to as "outer sites" of wafer 500. As defined within this disclosure, an "outer site" of a wafer has at least one side of the site that is not adjacent to another site or, in this case, die. Functional sites 502, which are un-shaded blocks, are inner sites of wafer 500. As defined within this disclosure, an "inner site" of a wafer is adjacent to another die or site on each side.

As discussed, warpage in wafer 500 may occur from attaching dies to the top surface of sites 502 and 504. Under-fill material and/or mold material, for example, used in multi-die ICs may induce significant warpage in wafer 500. The warpage is often particularly observable in outer sites. Warpage in wafer 500 may be countered by designating one or more certain sites of wafer 500 as spacer die sites 504 and, as such, attaching one or more spacer dies to spacer die sites 504.

As used within this disclosure, a "functional site" means a site of a wafer that implements a die to which one or more functional dies are mechanically and electrically attached. A functional site is eventually diced and forms a functional IC. One or more spacer dies may be only mechanically to a functional site in combination with one or more functional dies as described within this disclosure. As used within this disclosure, a "spacer die site" refers to a site of a wafer that implements a die to which only one or more spacer dies are mechanically attached. A spacer die site is not a functional IC before or after dicing. In one aspect, the interposer implemented by the spacer die site need not be functional. For example, the spacer die sites may not include the internal circuitry and/or the inter-die electrical connecting structures that a functional site includes. A spacer die site has no functional dies attached thereto.

Referring again to FIG. 5, functional die sites 502 may be dies to which one or more functional dies and optionally one or more spacer dies may be attached as described within this disclosure. Outer sites such as spacer die sites 504, however, are dies to which only spacer dies are attached to counter warpage in wafer 500. For example, the entire surface of spacer die sites 504 may be covered with a plurality of spacer dies attached using a die attach adhesive. The particular size and/or pattern of spacer dies can vary so long as the surface of each spacer die site 504 is substantially occupied by spacer dies. For example, the surface of each spacer die site 504 can be occupied or covered by dies in the same or similar manner as the surface of interposer 105 is occupied as shown in FIGS. 1 and 4-2, albeit using only spacer dies and no functional dies.

Consider an example in which each of functional sites 502 is an interposer. Functional dies may be attached to functional sites 502 while still in wafer form. For example, one or more functional dies can be applied to each functional site 502 of wafer 500. As such, any reflow process for solder bumps, under-fill, and application of mold is performed across wafer 500 prior to dicing, which may cause warpage in wafer 500 as a whole. One or more spacer dies may be attached, only mechanically, to each spacer die site 504 using a die attach adhesive as previously described while the interposers are still in wafer form. Regarding spacer die sites 504, only spacer dies are attached to such interposers so that the entire surface of each of spacer die sites 504 is covered, or substantially covered, by spacer dies with no functional dies attached thereto. Attaching spacer dies to spacer die sites 504 can reduce the warpage that occurs in wafer 500. Since only spacer dies are attached to spacer die sites 504, spacer die sites 504, when diced, are not functional ICs. In this regard, spacer die sites 504 need not be formed to include any of the circuitry such as wires, vias, TVs, and/or inter-die electrical connecting structures that are needed for implementation of an interposer, i.e., a die corresponding to functional sites 502.

As illustrated, a spacer die site 504 is shown blown up to include four spacer dies 515. Each spacer die 515 is implemented as described herein and attached to the top surface of spacer die site 504 using a die attach adhesive. In a further aspect, additional sites currently shown as functional sites 502 adjacent to spacer die sites 504 can be implemented to include only spacer dies depending upon the severity of warpage in wafer 500 that is to be countered. Further, in another example, each outer site need not be implemented as a spacer die site 504. One or more outer sites of wafer 500 can be implemented as functional sites 502.

Figure 6:
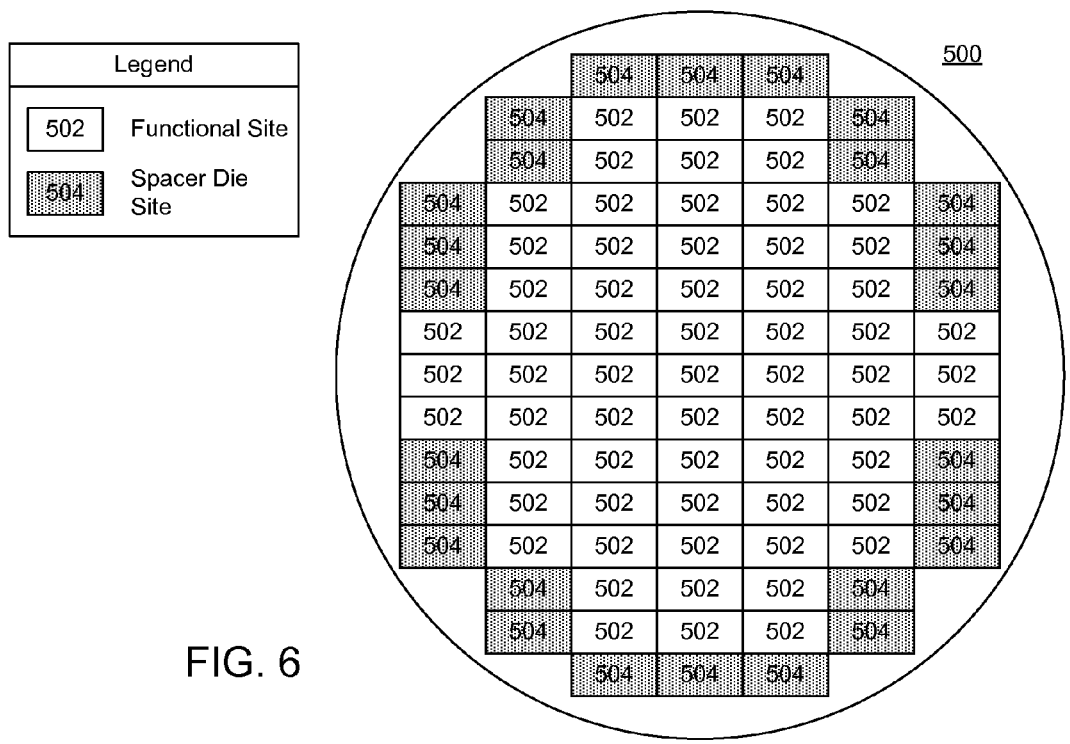
FIG. 6 is a diagram illustrating a top view of another exemplary implementation of the wafer of FIG. 5.

FIG. 6 is a diagram illustrating a top view of another exemplary implementation of wafer 500. In the example of FIG. 6, spacer die sites 504 are implemented in a majority of outer sites of wafer 500, but not for all outer sites. One or more outer sites of wafer 500 also are implemented as functional sites 502. Each inner site of wafer 500 is also implemented as a functional site 502.

Figure 7:
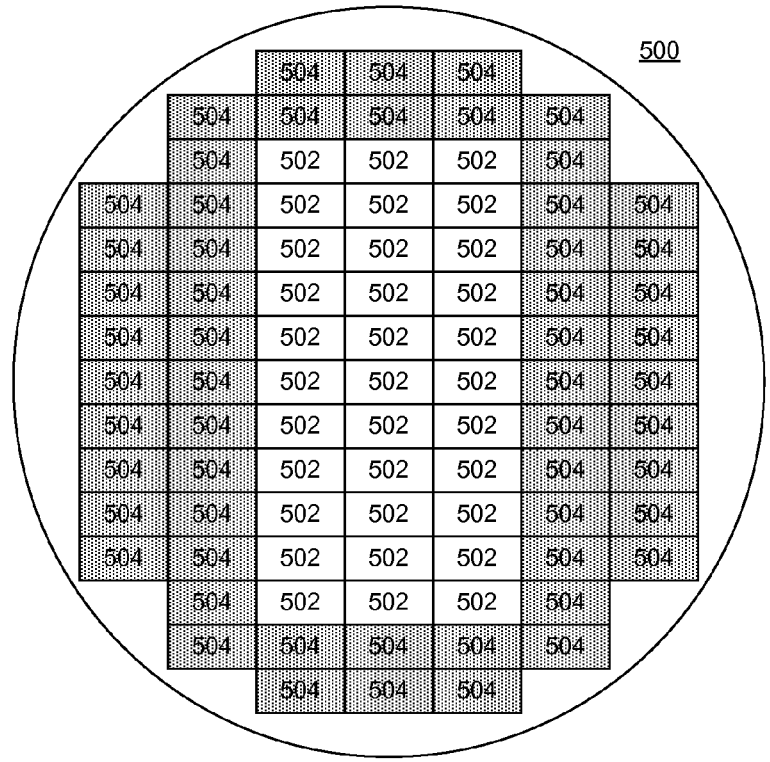
FIG. 7 is a diagram illustrating a top view of another exemplary implementation of the wafer of FIG. 5.

FIG. 7 is a diagram illustrating a top view of another exemplary implementation of wafer 500. In the example of FIG. 7, each outer site of wafer 500 is implemented as a spacer die site 504. Each site of wafer 500 immediately adjacent to an outer site also is implemented as a spacer die site 504. For example, considering the outer sites to form a first ring of spacer die sites 504, a next inner ring of spacer die sites 504 is formed for wafer 500. Each remaining inner site of wafer 500 is implemented as a functional site 502.

Figure 8:
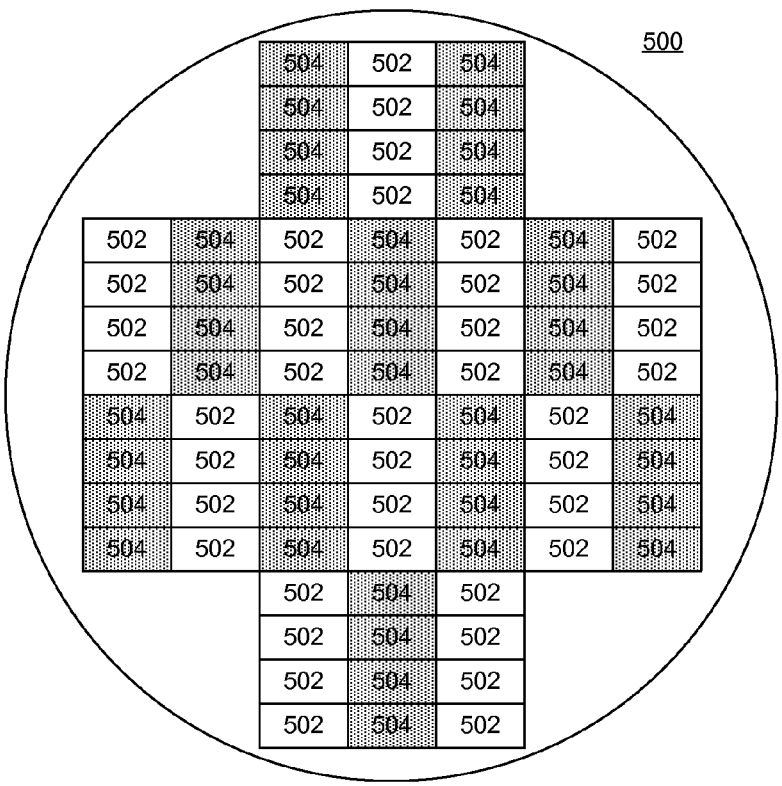
FIG. 8 is a diagram illustrating a top view of another exemplary implementation of the wafer of FIG. 5.

FIG. 8 is a diagram illustrating a top view of another exemplary implementation of wafer 500. In the example of FIG. 8, a checkerboard configuration of regions of functional sites 502 and spacer die sites 504 is formed. Each region may include one or more functional sites 502 or one or more spacer die sites 504 as the case may be. In the pictured example, each region includes four sites, though regions may include fewer or more sites. Accordingly, both rows and columns of regions alternate between a region of functional site(s) 502 and a region of spacer die site(s) 504. In the example of FIG. 8, each region has a same number of sites.

In another aspect, regions may vary in number of sites. For example, regions of spacer die sites 504 may have a different number of sites than regions of functional sites 502. The number of spacer die sites 504 within each region formed of spacer die sites 504 may differ one region to another. Similarly, the number of functional sites 502 within each region formed of functional sites 502 may differ from one region to another.

Figure 9:
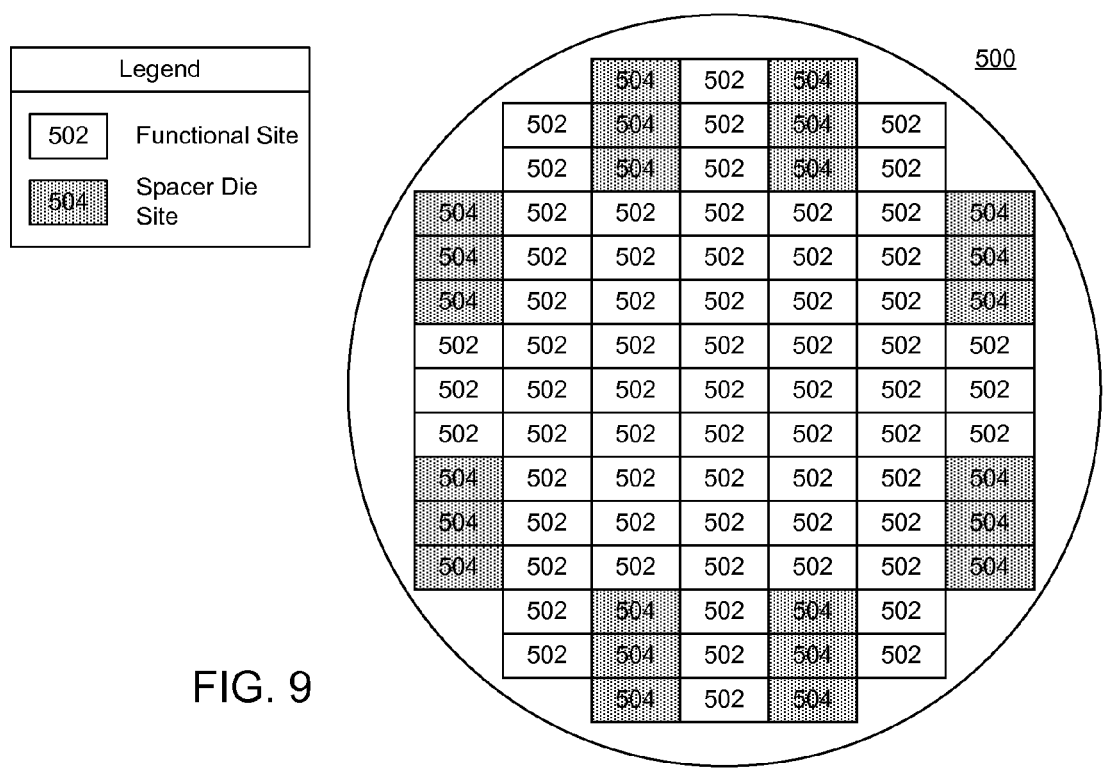
FIG. 9 is a diagram illustrating a top view of another exemplary implementation of the wafer of FIG. 5.

FIG. 9 is a diagram illustrating a top view of another exemplary implementation of wafer 500. In the example of FIG. 9, some outer sites are implemented as spacer die sites 504, while other outer sites are implemented as functional sites 502. Within FIG. 9, wafer 500 includes entire columns of functional sites 502, with intervening columns, e.g., alternating columns, that include one or more regions where each such region includes one or more spacer die sites 504.

Figure 10:
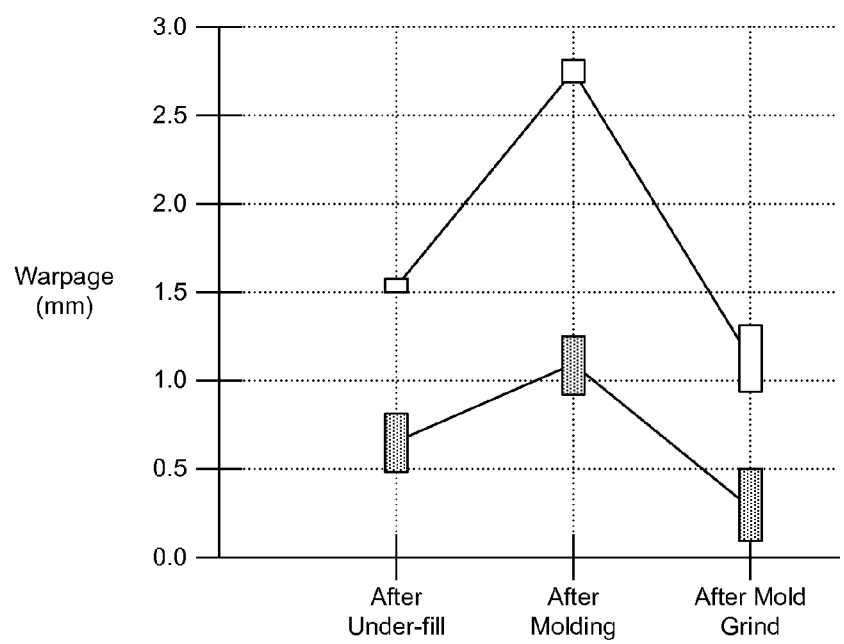
FIG. 10 is a graph illustrating reduction in warpage in a wafer achieved at various stages of wafer manufacture using spacer die sites.

FIG. 10 is a graph illustrating reduction in warpage in a wafer achieved at various stages of wafer manufacture using spacer die sites. The x-axis represents three different stages of wafer manufacture corresponding to a time after under-fill is applied, a time after mold material is applied referred to as "after molding," and a time after a grind process is applied to the mold material referred to as "after mold grinding." The y-axis represents amount of warpage observed in a wafer measured in millimeters (mm).

For purposes of discussion, FIG. 10 illustrates reduction in warpage where the height or thickness of the dies, illustrated as "h" in FIG. 3, attached to the interposer is approximately 340 µm. Accordingly, the height of the functional dies and the spacer dies is 340 µm or within a predefined tolerance of 340 µm. Further, measurements illustrated in FIG. 10 are for a multi-die IC in which four rectangular dies are placed on the functional sites of the wafer. Any of a variety of different spacer die configurations may be attached to the spacer die sites of the wafer. The wafer used to implement interposer dies and to which both the spacer dies and the functional dies are attached has a thickness of 775 µm or substantially 775 µm, which is a standard wafer height.

Referring to FIG. 10, in a wafer that includes no spacer die sites where each site is a functional site (502), the wafer exhibits approximately 1.5 mm of warpage after under-fill; approximately 2.75 mm of warpage after molding, and a range of approximately 0.9 to 1.25 mm of warpage after mold grinding. Using a wafer configuration similar to that of FIG. 6 where most of the outer sites of the wafer are implemented as spacer die sites (504), a significant reduction in wafer warpage is observed. In particular, warpage in the wafer after under-fill is reduced to a range of approximately 0.5 to 0.75 mm with spacer die sites. Warpage in the wafer after molding is reduced to a range of approximately 0.8 to 1.25 mm with spacer dies. Warpage in the wafer after mold grind is reduced to a range of approximately 0.1 to 0.5 mm with spacer die sites.

At each state of IC manufacture illustrated in FIG. 10, a significant reduction in wafer warpage is achieved by the use and inclusion of spacer die sites. In general, the more spacer die sites and/or the greater density of spacer die sites, the less warpage is observed.

Figure 11:
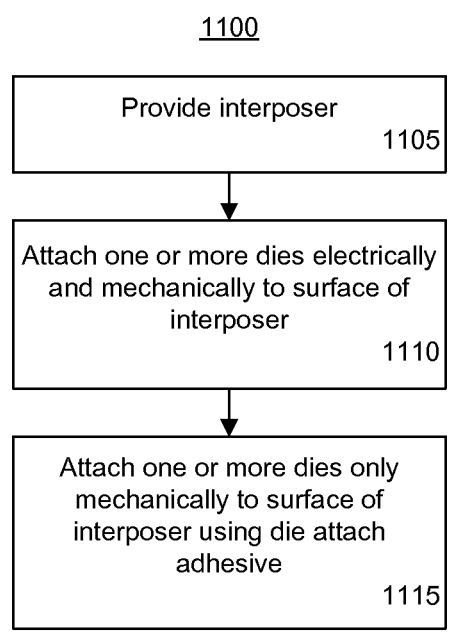
FIG. 11 is a flow chart illustrating an exemplary method of creating a multi-die IC using spacer dies.

FIG. 11 is a flow chart illustrating an exemplary method 1100 of creating a multi-die IC using spacer dies. Method 1100 can be implemented using any of a variety of IC manufacturing techniques and equipment known to the skilled artisan.

In block 1105, an interposer is provided. In one aspect, the interposer is still in wafer form. In another aspect, the interposer may be in the form of an individual die, e.g., post wafer dicing.

In block 1110, a functional die, e.g., a first die, is mechanically and electrically attached to a surface of the interposer. The surface to which the functional die is attached is a top, or first, surface of the interposer. Mechanically and electrically attaching the functional die to the interposer can include connecting functional circuitry within the functional die to functional circuitry within the interposer die. For example, the functional die can be connected to the first surface of the interposer using a plurality of solder bumps that create the electrical and mechanical connections described. In addition, under-fill can be applied to the functional die.

As part of block 1110, it should be appreciated that one or more additional functional dies may be mechanically and electrically attached to the surface of the interposer. For example, each other functional die of the multi-die IC being created may be attached in block 1110 using solder bumps. As part of the attaching using solder bumps, a reflow-process may be performed. One or more of the mechanically and electrically attached dies may be communicatively linked to one another by one or more wires within the interposer through the solder bumps. When the interposers are still in wafer form, functional dies are attached only to functional sites of the wafer.

In block 1115, a spacer die, e.g., a second die, is mechanically attached to the first surface of the interposer using a die attach adhesive. Thus, the spacer die is only mechanically attached, i.e., not electrically attached, to the interposer. The spacer die is mechanically attached to the surface of the interposer without using solder bumps and without using under-fill.

In one aspect, the spacer die can be attached by applying the die attach adhesive to a surface of the spacer die. The die attach adhesive is attached to the surface of the spacer die that is placed in contact with the top surface of the interposer. In another aspect, the die attach adhesive is applied to the surface of the spacer die while still in wafer form. In yet another aspect, the die attach adhesive is applied to the surface of the spacer die after dicing. The surface of the spacer die to which the die attach adhesive is applied is placed in mechanical contact with the surface of the interposer.

In a further aspect, the spacer die is only mechanically attached to the surface of the interposer subsequent to connecting the functional die or dies to the surface of the interposer die using the plurality of solder bumps. Since no solder bumps are used for attaching the spacer die, a reflow process is not required to attach the spacer die to the surface of the interposer. The spacer die, for example, may be attached to the surface of the interposer following a reflow process that is used to attach any functional dies to the surface of the interposer using solder bumps. The spacer die(s) may be attached prior to, or after, under-fill is applied to the functional die(s) attached using solder bumping. In still a further aspect, the functional and spacer dies may be attached so that under-fill applied to the first die(s) that are mechanically and electrically attached cures concurrently with the die attach adhesive used to mechanically attach the second die(s).

In one aspect, the wafer is implemented to include both functional sites and spacer die sites. In that case, the spacer dies are attached to the spacer die sites. In the case where the functional sites include one or more spacer dies as previously described, the spacer dies also may be attached to the functional sites where needed.

The inventive arrangements described within this specification relate to a multi-die IC structure and, more particularly, a stacked die IC in which one or more dies are attached to a surface of an interposer. The multi-die IC includes one or more spacer dies that are included to reduce warpage of the interposer. Rather than utilizing the same die attachment technique used for the functional dies, other less complex and less exacting die attachment techniques are used for the spacer die(s). In particular, die attach adhesive is used to attach spacer dies while solder bumps are used to attach functional dies to the interposer.

Accordingly, processes such as solder bump joining, e.g., reflow, under-filling, and the like that are necessary for solder bump attachment are not required for attaching spacer dies. In addition, the spacer die itself need not include any inter-die electrical connecting structures that would be required were solder bumps used. Similarly, inter-die electrical connecting structures on the surface of the interposer need not be included or formed in those regions in which a spacer die is to be located.

For purposes of explanation, specific nomenclature is set forth to provide a thorough understanding of the various inventive concepts disclosed herein. The terminology used herein, however, is for the purpose of illustrating the features described and is not intended to be limiting.

For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The flowchart and block diagrams in the Figures illustrate the architecture, functionality, and operation of possible implementations of process(es), machine(s), manufacture(s), and/or systems utilizing one or more of the features described herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features described within this disclosure can be embodied in other forms without departing from the spirit or essential attributes thereof. Accordingly, reference should be made to the following claims, rather than to the foregoing disclosure, as indicating the scope of such features and implementations.

What is claimed is:

1. An integrated circuit, comprising:
an interposer die comprising a surface;
a first die mechanically and electrically attached to the surface of the interposer die;
a second die only mechanically attached to the surface of the interposer die using a die attach adhesive;
a third die mechanically and electrically attached to the first surface of the interposer die; and
wherein the first die and the third die are communicatively linked by a wire of the interposer die.

2. The integrated circuit of claim 1, wherein the second die is not electrically attached to the first surface of the interposer die.

3. The integrated circuit of claim 1, wherein the second die does not include functional circuitry.

4. The integrated circuit of claim 1, wherein the second die does not include inter-die electrical connecting structures configured to contact solder bumps.

5. The integrated circuit of claim 1, wherein the first die comprises functional circuitry electrically connected to functional circuitry within the interposer die.

6. The integrated circuit of claim 1, wherein the first die is attached to the first surface of the interposer die using a plurality of solder bumps.

7. The integrated circuit of claim 6, wherein the first die is under-filled and the second die is not under-filled.

8. A method, comprising:
providing an interposer die comprising a first surface;
mechanically and electrically attaching a first die to the first surface of the interposer die;
attaching, only mechanically, a second die to the first surface of the interposer die using a die attach adhesive; and
mechanically and electrically attaching a third die to the surface of the interposer die;
wherein the first die and the third die are communicatively linked by a wire of the interposer die.

9. The method of claim 8, wherein the interposer die is in wafer form.

10. The method of claim 8, wherein mechanically and electrically attaching the first die to the first surface of the interposer die comprises:
connecting functional circuitry within the first die to functional circuitry within the interposer die.

11. The method of claim 8, wherein mechanically and electrically attaching the first die to the first surface of the interposer die comprises:
connecting the first die to the first surface of the interposer die using a plurality of solder bumps.

12. The method of claim 11, further comprising:
applying under-fill to the first die.

13. The method of claim 12, wherein the second die is mechanically attached to the surface of the interposer die without using solder bumps and without using under-fill.

14. The method of claim 12, wherein the second die is only mechanically attached to the surface of the interposer die subsequent to connecting the first die to the surface of the interposer die using the plurality of solder bumps.

15. The method of claim 8, further comprising:
applying the die attach adhesive to a surface of the second die; and
placing the surface of the second die in mechanical contact with the surface of the interposer die.

16. The method of claim 15, wherein the die attach adhesive is applied to the surface of the second die while still in wafer form.

* * * * *